US010255970B2

(12) United States Patent
Ishii (10) Patent No.: US 10,255,970 B2
(45) Date of Patent: *Apr. 9, 2019

(54) SEMICONDUCTOR DEVICE (71) Applicant: Renesas Electronics Corporation, Tokyo (JP)

(72) Inventor: Yuichiro Ishii, Tokyo (JP)

(73) Assignee: Renesas Electronics Corporation, Tokyo (*) Notice: Subject to any disclaimer, the term of this patent is extended or adjusted under 35 U.S.C. 154(b) by 0 days.

This patent is subject to a terminal disclaimer.

(21) Appl. No.: 15/627,535

(22) Filed: Jun. 20, 2017

(65) Prior Publication Data

US 2017/0287553 A1 Oct. 5, 2017

Related U.S. Application Data

(63) Continuation of application No. 15/212,162, filed on Jul. 15, 2016, now Pat. No. 9,721,647.

(30) Foreign Application Priority Data

Sep. 11, 2015 (JP) ................................. 2015-179683

(51) Int. Cl.
*G11C 11/00* (2006.01)
*G11C 11/419* (2006.01)
*G11C 11/418* (2006.01)
*H01L 27/11* (2006.01)
*H01L 27/02* (2006.01)

(52) U.S. Cl.
CPC .......... *G11C 11/419* (2013.01); *G11C 11/418* (2013.01); *H01L 27/1104* (2013.01); *H01L 27/0207* (2013.01); *H01L 27/1116* (2013.01)

(58) Field of Classification Search
CPC ..... G11C 16/0483; G11C 16/08; G11C 16/10; G11C 16/26; G11C 11/419; G11C 7/10; G11C 8/12; G11C 16/16; G11C 7/12; G11C 7/22; G11C 11/4093
USPC ..... 65/230.06, 189.09, 226, 63, 154, 189.11, 65/230.03, 148, 158, 171, 173, 185.11, 65/185.17, 194, 196
See application file for complete search history.

(56) References Cited

U.S. PATENT DOCUMENTS

| 4,338,678 | A | 7/1982 | Akatsuka |
| 7,502,275 | B2 | 3/2009 | Nii et al. |
| 8,659,324 | B2 | 2/2014 | Oike |
| 9,721,647 | B2* | 8/2017 | Ishii ...................... G11C 11/419 |

(Continued)

FOREIGN PATENT DOCUMENTS

| JP | 55-150189 A | 11/1980 |
| JP | 2007-004960 A | 1/2007 |

(Continued)

OTHER PUBLICATIONS

Office Action dated Oct. 2, 2018, in Japanese Patent Application No. 2015-179683.

*Primary Examiner* — Thong Q Le
(74) *Attorney, Agent, or Firm* — Shapiro, Gabor and Rosenberger, PLLC (57) ABSTRACT

An assist driver is coupled to an end of a word line to which a word line driver is not coupled, and couples the other end of the word line to a first power source, in accordance with a voltage of the other end of the word line.

14 Claims, 8 Drawing Sheets

(56) References Cited

U.S. PATENT DOCUMENTS

2011/0149674 A1* 6/2011 Yeung .................. G11C 8/08
                                              365/230.06

FOREIGN PATENT DOCUMENTS

JP     2007-228470 A    9/2007
JP     2014-099225 A    5/2014

* cited by examiner

SEMICONDUCTOR DEVICE

CROSS-REFERENCE TO RELATED APPLICATIONS

The disclosure of Japanese Patent Application No. 2015-179683 filed on Sep. 11, 2015 including the specification, drawings and abstract is incorporated herein by reference in its entirety.

The present invention relates to a semiconductor device, for example, a semiconductor device having memory cells in which data writing and data reading are executed by activating word lines.

BACKGROUND

In the related art, a well-known semiconductor device includes a memory array, word lines, and word line drivers. The memory array includes a plurality of memory cells arranged in matrix. The word lines are provided respectively for the rows of the memory array. The word line drivers activate the word line of a selected row, at the time of data reading/writing from/to the memory cell (see Japanese Unexamined Patent Application Publication No. 2014-99225).

SUMMARY

However, recently, the driving force of the transistors has improved, and micro-fabrication of the wiring has advanced. As a result, the effect of the resistance component of the wiring is apparent.

In a semiconductor device including a memory array, a problem is that the rising speed of a voltage in a position far from a word line driver is lower than the rising speed of a voltage in a position close to the word line driver, due to the effect of the resistance component of the word line, at the time of activating the word line. As a result, in a memory cell in a position far from the word line driver, a cell current is delayed in flowing as compared to a memory cell in a position close to the word line driver. This causes a delay in writing data into the memory cell and a delay in reading data from the memory cell.

Any other objects and new features will be apparent from the descriptions of the present specification and the accompanying drawings.

According to an embodiment, there is provided a semiconductor device, which includes an assist driver(s) which is(are) coupled to other end(s) of a word line(s) on a side where a word line driver is not coupled, and couples the other end of the word line to the first power source in accordance with a voltage of the other end of the word line.

According to a semiconductor device of an embodiment, it is possible to avoid that the rising speed of a voltage in a position far from the word line driver is lower than the rising speed of a voltage in a position close to the word line driver, at the time of activating the word line.

DETAILED DESCRIPTION

Preferred embodiments of the present invention will now be described using the accompanying drawings.

First Embodiment

Figure 1:
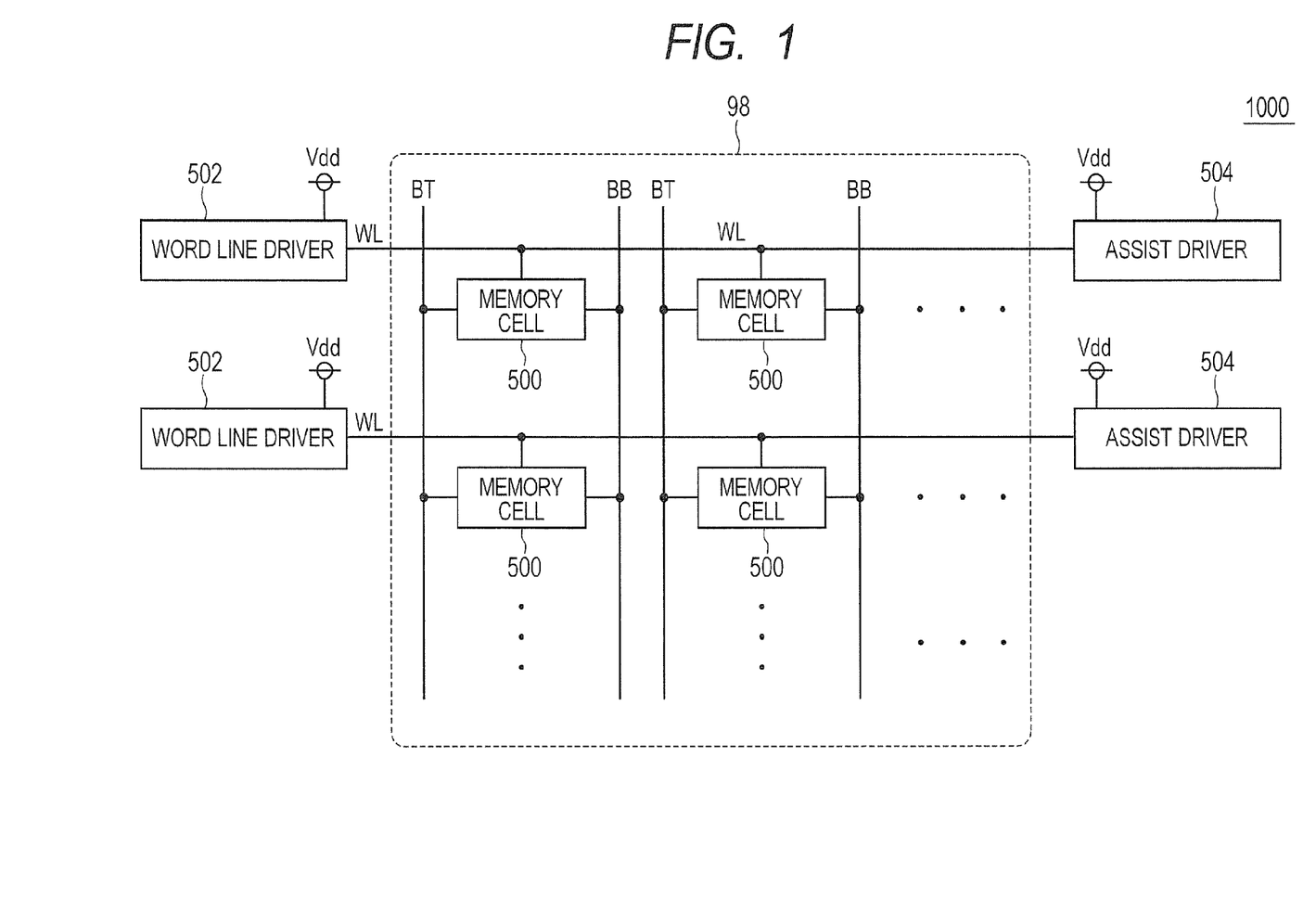
FIG. 1 is a diagram illustrating a configuration of a semiconductor device of a first embodiment.

FIG. 1 is a diagram illustrating a configuration of a semiconductor device of a first embodiment.

Refer to FIG. 1, this semiconductor device 1000 includes a memory array 98, a plurality of word lines WL, a plurality of bit line pairs BT and BB, a plurality of word line drivers 502, a first power source Vdd, and a plurality of assist drivers 504.

The memory array 98 includes a plurality of memory cells 500 arranged in matrix.

The word lines WL are provided and correspond respectively to the rows of the memory array 98. The word lines WL are coupled to the memory cells 500 of the corresponding rows.

The bit line pair BT and BB is provided and corresponds respectively to the columns of the memory array 98. The bit line pair BT and BB is coupled to the memory cells 500 of the corresponding columns.

The word line drivers 502 are coupled to one ends of the word lines WL. When a corresponding row is selected, one end of the word line WL is coupled to the first power source Vdd.

The assist drivers 504 are coupled to the other ends of the word lines WL. The other ends of the word lines WL are coupled to the power sources Vdd in accordance with a voltage of the other ends of the word lines WL.

Accordingly, in this embodiment, a voltage of the other end of the word line WL is caused to rise by the assist driver 504. Thus, at the time of activating the word line WL, it is possible to prevent that the rising speed of a voltage in a position far from the word line driver 502 is lower than the rising speed of a voltage in a position close to the word line driver 502.

Second Embodiment

Figure 2:
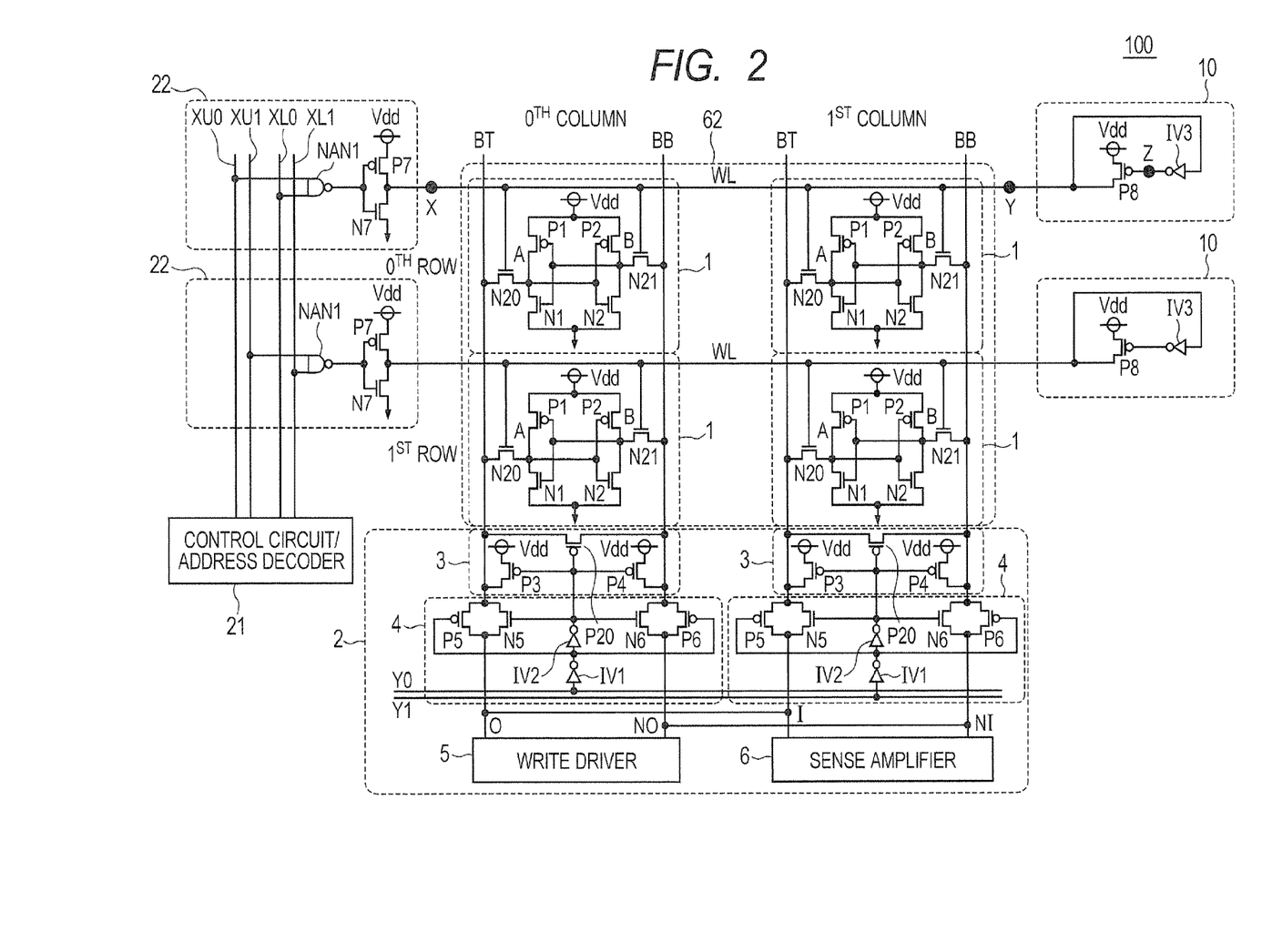
FIG. 2 is a diagram illustrating a configuration of a semiconductor device of a second embodiment.

FIG. 2 is a diagram illustrating a configuration of a semiconductor device of a second embodiment.

A semiconductor device 100 includes a memory array 62, a plurality of word lines WL, a plurality of bit line pairs BT and BB, a plurality of word line drivers 22, a plurality of assist drivers 10, a plurality of column selectors 4, a plurality of pre-charge circuits 3, a control circuit/address decoder 21, a plurality of write drivers 5, and a plurality of sense amplifiers 6.

The memory array 62 includes a plurality of memory cells 1 arranged in matrix. In FIG. 2, the memory cells 1 are represented in the form of two rows and two columns. The memory cells 1 are SRAM (Static Random Access Memory) cells.

Each of the memory cells 1 includes PMOS (Metal-Oxide-Semiconductor) transistors P1 and P2 as load transistors, NMOS transistors N1 and N2 as driver transistors, and NMOS transistors N20 and N21 as access transistors.

The sources of the load transistors P1 and P2 are both coupled to an internal power source voltage Vdd, the drains thereof are coupled respectively to memory nodes A and B, and the gates thereof are coupled respectively to the memory nodes B and A.

The sources of the driver transistors N1 and N2 are both coupled to a grounded power source (grounded), the drains thereof are coupled respectively to the memory nodes A and B, and the gates thereof are coupled respectively to the memory nodes B and A.

The sources of the access transistors N20 and N21 are coupled respectively to the memory nodes A and B, the drains thereof are coupled to corresponding bit lines BT and BB, and the gates thereof are both coupled to corresponding word lines WL.

A PMOS transistor P1 and an NMOS transistor N1 form an inverter, and output an inverted signal of data written into the memory node B to the memory node A. A PMOS transistor P2 and an NMOS transistor N2 form an inverter, and output an inverted signal of data written into the memory node A to the memory node B. Thus, the PMOS transistors P1 and P2 and the NMOS transistors N1 and N2 form latch circuits which keep data written in the memory nodes A and B.

The word lines WL are provided and respectively correspond to the rows of the memory array 62. The word lines WL are coupled to the memory cells 500 of the corresponding rows.

The bit line pairs BT and BB are provided and correspond respectively to the columns of the memory array 62. The bit line pairs BT and BB are coupled to the memory cells 500 of the corresponding columns.

The control circuit/address decoder 21 includes a row decoder and a column decoder, to drive the address-designated word line WL into a selection state. The row decoder generates a row selection signal in accordance with a row address signal, while the column decoder selects a bit line pair corresponding to a selected column in accordance with a column address signal.

Specifically, the row decoder decodes a row address signal to generate a row selection signal, at the time of reading operation or writing operation. For example, at the time of selecting the $0^{th}$ row illustrated in FIG. 2, the row decoder activates and makes select signals XU0 and XL0 into a high level. At the time of selecting the $1^{st}$ row illustrated in FIG. 2, it activates and makes select signals XU1 and XL1 into a high level.

At the time of reading operation or writing operation, the column decoder decodes a column address signal to generate a column selection signal. For example, the column decoder activates and makes a select signal Y0 into a high level, at the time of selecting the $0^{th}$ column illustrated in FIG. 2, and activates and makes a select signal Y1 into a high level, at the time of selecting the $1^{st}$ column illustrated in FIG. 2.

A column selector 4 includes an inverter IV1, an inverter IV2, PMOS transistors P5 and P6, and NMOS transistors N5 and N6. The inverter IV1 in the column selector 4 of the $0^{th}$ column receives a select signal Y0. The inverter IV1 in the column selector 4 of the $1^{st}$ column receives a select signal Y1. The inverter IV2 receives the output of the inverter IV1.

The PMOS transistor P5 and the NMOS transistor N5 are provided between the bit line BT, an output node O of a write driver 5, and an input node I of a sense amplifier 6. The gate of the PMOS transistor P5 receives the output of the inverter IV1. The gate of the NMOS transistor N5 receives the output of the inverter IV2. The PMOS transistor P6 and the NMOS transistor N6 are provided between the bit line BB, an inverted output node NO of the write driver 5, and an inverted input node NI of the sense amplifier 6. The gate of the PMOS transistor P6 receives the output of the inverter IV1. The gate of the NMOS transistor N6 receives the output of the inverter IV2.

A pre-charge circuit 3 includes PMOS transistors P3, P4, and P20. The PMOS transistor P3 is provided between the power source Vdd and the bit line BT. The PMOS transistor P3 receives the output of the inverter IV2. The PMOS transistor P4 is provided between the power source Vdd and the bit line BB. The PMOS transistor P4 receives the output of the inverter IV2. The PMOS transistor P20 is provided between the bit line BT and the bit line BB. The gate of the PMOS transistor P20 receives the output of the inverter IV2.

When the select signal Y0 for selecting the $0^{th}$ column is at a low level, the following procedure will be executed.

The PMOS transistors P3, P4, P4, and P20 will be ON, and the bit line pair BT and BB of the $0^{th}$ column is pre-charged with the voltage Vdd.

When the select signal Y0 for selecting the $0^{th}$ column is at a high level, the following procedure will be executed.

The PMOS transistors P3, P4, P4, and P20 will be OFF, and precharging of the bit line pair BT and BB of the $0^{th}$ column is completed. The PMOS transistors P5 and P6 and the NMOS transistors N5 and N6 are ON. The bit line pair BT and BB of the $0^{th}$ column is coupled to the write driver 5 and the sense amplifier 6.

When the select signal Y1 for selecting the $1^{st}$ column is at a low level, the following procedure will be executed.

The PMOS transistors P3, P4, P4, and P20 are ON. The bit line pair BT and BB of the $1^{st}$ column is pre-charged with the voltage Vdd.

When the select signal Y1 for selecting the $1^{st}$ column is at a high level, the following procedure will be executed.

The PMOS transistors P3, P4, P4, and P20 will be OFF, and precharging of the bit line pair BT and BB of the $1^{st}$ column is completed. The PMOS transistors P5 and P6 and the NMOS transistors N5 and N6 will be ON. The bit line pair BT and BB of the $1^{st}$ column is coupled to the write driver 5 and the sense amplifier 6.

Each of the write driver 5 and the sense amplifier 6 is provided for each adjacent two columns, and coupled to the bit line pair BT and BB of the adjacent two columns. Each of the write driver 5 and the sense amplifier 6 is shared commonly by the two columns. As a result, the memory array 62 is formed in a horizontally long shape. In addition, the word lines WL are formed long, exhibiting a large effect of this embodiment.

The write driver 5 outputs a voltage corresponding to the write data to the bit line pair BT and BB of a selected one of the $0^{th}$ and $1^{st}$ columns, that is, (high level, low level) or (low level, or high level), at the time of writing data to the memory cell 1.

The sense amplifier 6 amplifies a potential difference of the bit line pair BT and BB of the selected column of the $0^{th}$ and $1^{st}$ columns, at the time of reading data from the memory cell 1.

Word line drivers 22 and assist drivers 10 are provided and correspond to the word lines WL of the memory array 62. Each of the word line driver 22 is coupled to the front end X of a corresponding word line WL. The assist driver 10 is coupled to the terminal end Y of a corresponding word line WL.

The word line driver 22 couples an end of the coupled word line WL to the power source Vdd, when a corresponding row is selected.

The word line driver 22 includes an inverter having a NAND circuit NAN1, a PMOS transistor P7, and an NMOS transistor N7. The input of this inverter is coupled to the output of the NAND circuit NAN1, while the output of this inverter is coupled to the front end of the word line WL.

The NAND circuit NAN1 in the word line driver 22 of the $0^{th}$ row receives the select signals XU0 and XL0. When the $0^{th}$ row is selected, the select signals XU0 and XL0 are at a high level, and the output of the NAND circuit NAN1 is at a low level. When the $0^{th}$ row is not selected, at least one of the select signals XU0 and XL0 is at a low level, and the output of the NAND circuit NAN1 is at a high level.

The NAND circuit NAN1 in the word line driver 22 of the $1^{st}$ row receives the select signals XU1 and XL1. When the $1^{st}$ row is selected, the select signals XU1 and XL1 are at a high level, and the output of the NAND circuit NAN1 is at a low level. When the $1^{st}$ row is not selected, at least one of the select signals XU1 and XL1 is at a low level, and the output of the NAND circuit NAN1 is at a high level.

When the output of the NAND circuit NAN1 is at a low level, the PMOS transistor P7 is ON, and the NMOS transistor N7 is OFF. As a result, the front end X of the word line WL is coupled to the power source Vdd, and the voltage of the front end of the word line WL rises. This rise of the voltage is gradually transmitted to the end terminal of the word line WL.

When the output of the NAND circuit NAN1 is at a high level, the PMOS transistor P7 is OFF, and the NMOS transistor N7 is ON. As a result, the front end X of the word line WL is grounded, and the voltage of the front end of the word line WL rises. This rise of the voltage is gradually transmitted to the terminal end of the word line WL.

The assist driver 10 couples or disconnects the terminal end Y of a corresponding word line WL to or from the power source Vdd, in accordance with the voltage of the other end of the corresponding word line WL.

The assist driver 10 includes an inverter IV3 and a PMOS transistor P8.

The PMOS transistor P8 is provided between the terminal end Y of the word line WL and the power source Vdd. The input of the inverter IV3 is coupled to the end terminal Y of the word line WL, while the output of the inverter IV3 is coupled to the gate of the PMOS transistor P8.

Figure 3:
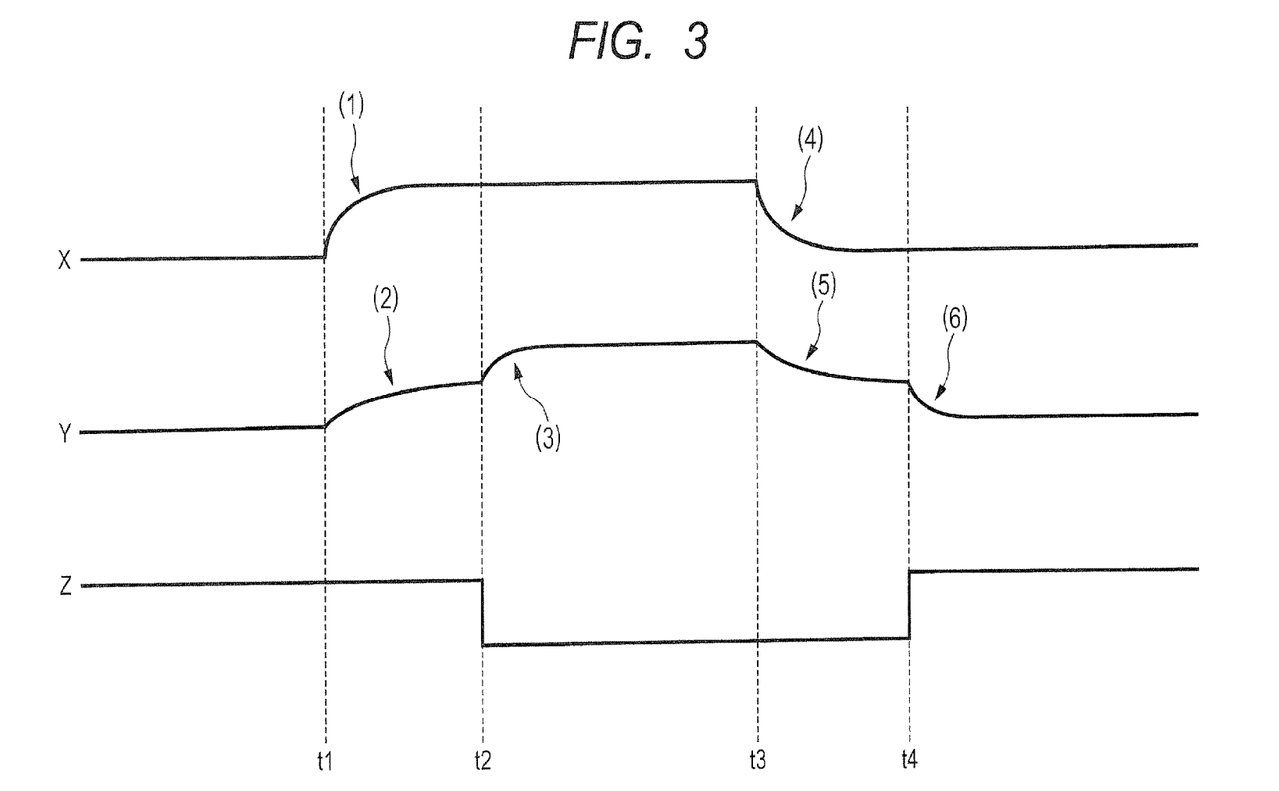
FIG. 3 is a diagram illustrating voltage changes of the front end and the terminal end of a word line WL, and an assist driver, in the second embodiment.

FIG. 3 is a diagram illustrating voltage changes of the front end and the terminal end of a word line WL, and an assist driver 10, in the second embodiment.

At a time t1, when the front end X of the word line WL is coupled to the power source Vdd by the word line driver 22 of the selected row, the voltage of the front end X of the word line WL rises relatively at a high speed, as illustrated by (1), while the voltage of the end terminal Y of the word line WL rises relatively at a low speed, as illustrated by (2).

At a time t2, when the voltage of the end terminal Y of the word line WL exceeds a threshold voltage of the inverter IV3 in the assist driver 10, the voltage of an output terminal Z of the inverter IV3 is at a low level. Then, the PMOS transistor P8 in the assist driver 10 is ON. As a result, the power source Vdd is coupled to the terminal end Y of the word line WL, thus accelerating the rise of the voltage at the terminal end Y, as illustrated by (3).

At a time t3, when the selected row shifts to a non-selected row, and when the front end X of the word line WL is grounded by the word line driver 22, the voltage of the front end X of the word line WL falls relatively at a high speed, as illustrated by (4). Because the PMOS transistor P8 remains ON, the voltage of the terminal end Y of the word line WL falls relatively at a low speed, as illustrated by (5).

At a time T4, when the voltage of the end terminal Y of the word line WL is equal to or lower than the threshold value of the inverter IV3 in the assist driver 10, the voltage of the output terminal Z of the inverter IV3 is at a high level. Then, the PMOS transistor P8 in the assist driver 10 is OFF. As a result, the power source Vdd and the terminal end Y of the word line WL are disconnected, thus accelerating the fall of the voltage at the terminal end Y, as illustrated by (6).

According to this embodiment, as described above, by the assist driver 10, the terminal end Y of the word line WL is coupled to the power source Vdd at the time of activating the word line WL. In addition, the terminal end Y of the word line WL and the power source Vdd are disconnected at the time of inactivating the word line WL. Thus, it is possible to avoid that the rising speed and the falling speed of the voltage in a position far from the word line driver 22 are lower than the rising speed and the falling speed of the voltage in a position close to the word line driver 22.

Third Embodiment

Figure 4:
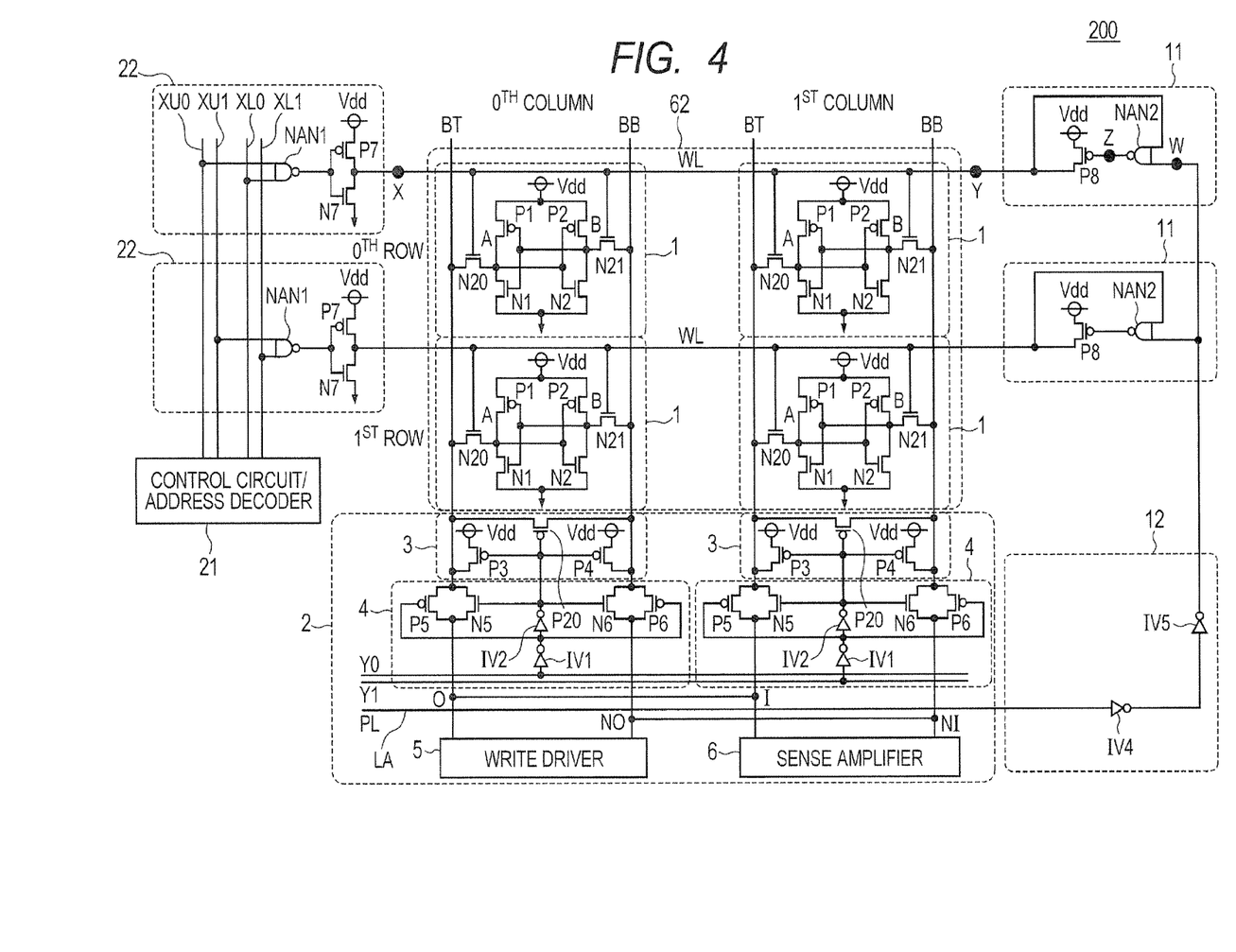
FIG. 4 is a diagram illustrating a configuration of a semiconductor device of a third embodiment.

FIG. 4 is a diagram illustrating a configuration of a semiconductor device of a third embodiment.

Descriptions will now be made to any of those differences of a semiconductor device 200 of FIG. 4 from the semiconductor device 100 of FIG. 2.

The assist control circuit 12 includes two stages of inverters IV4 and IV5.

The control circuit/address decoder 21 transmits a control signal pulse PL to the assist control circuit 12 and an assist driver 11, through a signal wiring LA. The signal wiring LA is provided outside the memory array 62, in a direction horizontal to the substrate where the semiconductor device 200 is implemented.

The inverter IV4 receives a control signal pulse PL from the control circuit/address decoder 21. The inverter IV5 receives an output from the inverter IV4.

The assist driver 11 includes a NAND circuit NAN2 and a PMOST transistor P8.

The PMOS transistor P8 is provided between the terminal end Y of the word line WL and the power source Vdd. In this embodiment, the PMOS transistor P8 is ON, when the voltage of the terminal end Y of the word line WL increases up to a predetermined value, at the rising time of the word line WL. It is OFF in response to a control signal from the control circuit/address decoder 21, at the falling time of the word line WL.

The input of the NAND circuit NAN2 is coupled to the terminal end Y of the word line WL, while the other input thereof is coupled to the inverter IV5. The output of the NAND circuit NAN2 is coupled to the gate of the PMOS transistor P8.

The control signal pulse PL is output from the control circuit/address decoder 21, and input to the NAND circuit NAN2 through the inverters IV4 and IV5. This control signal pulse PL is at a high level in a period since the rising start time of the word line WL until the voltage of the terminal end Y of the word line WL reaches Vdd, and the pulse is at a low level in a period since the falling start time of the word line WL until the voltage of the terminal end Y of the word line WL reaches a ground voltage (0V).

Figure 5:
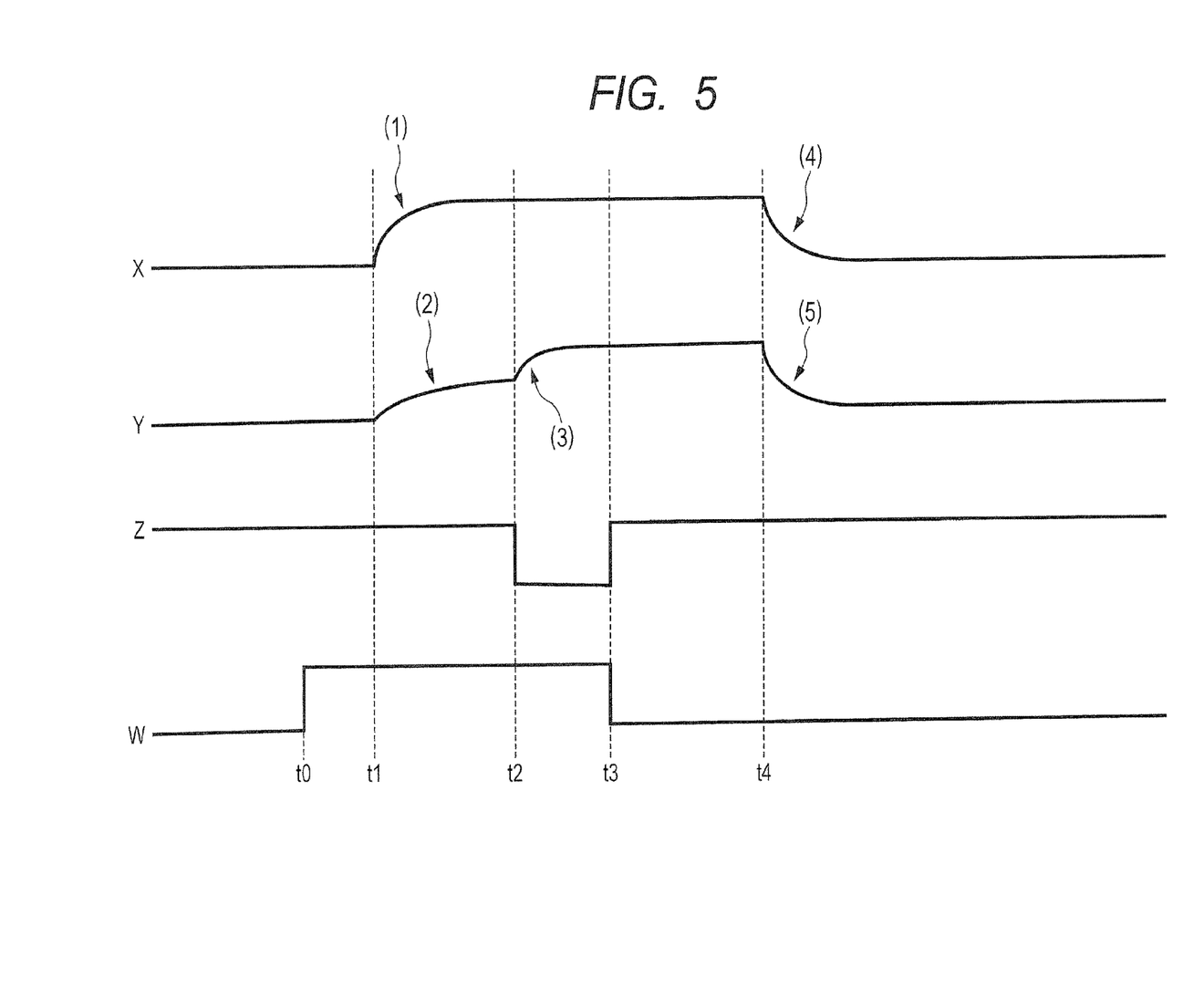
FIG. 5 is a diagram illustrating voltage changes of the front end and terminal end of a word line WL, and an assist driver, in the third embodiment.

FIG. 5 is a diagram illustrating voltages changes in the front end and terminal end of a word line WL, and an assist driver, in the third embodiment.

At a time t0, the voltage of an input terminal W of the NAND circuit NAN2 rises, upon reception of a control signal pulse PL output from the control circuit/address decoder 21.

At a time t1, when the front end X of the word line WL is coupled to the power source Vdd by the word line driver 22 of a selected row, the voltage of the front end X of the word line WL rises relatively at a high speed, as illustrated by (1), and the voltage of the terminal end Y of the word line WL rises relatively at a low speed, as illustrated by (2).

At a time t2, if the voltage of the terminal end Y of the word line WL is sufficiently high and exceeds a threshold value of the inverter included in the NAND circuit NAN2, the voltage of the output terminal Z of the NAND circuit NAN2 in the assist driver 10 is at a low level. Then, the PMOS transistor P8 in the assist driver 10 will be ON. As a result, the power source Vdd is coupled to the terminal end Y of the word line WL, thus accelerating the rise of the voltage at the terminal end Y, as illustrated by (3).

At a time t3, if the control signal pulse PL falls at the input terminal W of the NAND circuit NAN2, the voltage of the output terminal Z of the NAND circuit NAN2 is at a high level. Then, the PMOS transistor P8 will be OFF. As a result, the power source Vdd and the terminal end Y of the word line WL are disconnected.

At a time t4, when the selected row shifts to a non-selected row, and when the front end X of the word line WL is grounded by the word line driver 22, the voltage of the front end X of the word line WL falls relatively at a high speed, as illustrated by (4). Because the PMOS transistor P8 has already been OFF, the voltage of the terminal end Y of the word line WL falls relatively at a high speed as well, as illustrated by (5).

In the second embodiment, there is a time period in which both of the pull-up PMOS transistor P8 in the assist driver 10 and the NMOS transistor N7 included in the word line driver 22 are ON, at the inactivation time of the word line WL. Thus, as illustrated by (5) of FIG. 3, the voltage of the terminal end Y becomes to fall at a low speed.

In this embodiment, on the contrary, there is no such a time period in which both of the pull-up PMOS transistor P8 and the NMOS transistor N7 included in the word line driver 22 are ON. Thus, as illustrated by (5) of FIG. 5, the voltage of the terminal end Y falls at the same speed as that of the front end X. As a result, it is possible to realize the high-speed operation and the low power consumption operation at the inactivation time of the word line WL.

Because the word line WL is arranged in the semiconductor layer right above an area in which the memory cells 1 are arranged, it is hardly designed that thick word lines WL are formed. In this embodiment, the control signal pulse PL output from the control circuit/address decoder 21 is transmitted to the assist control circuit 12 and the assist driver 11 through the signal wiring LA arranged outside the memory array 62. Thus, it is possible to realize low resistance by having the thick width, without being restricted on the layout like the word line WL.

Fourth Embodiment

Figure 6:
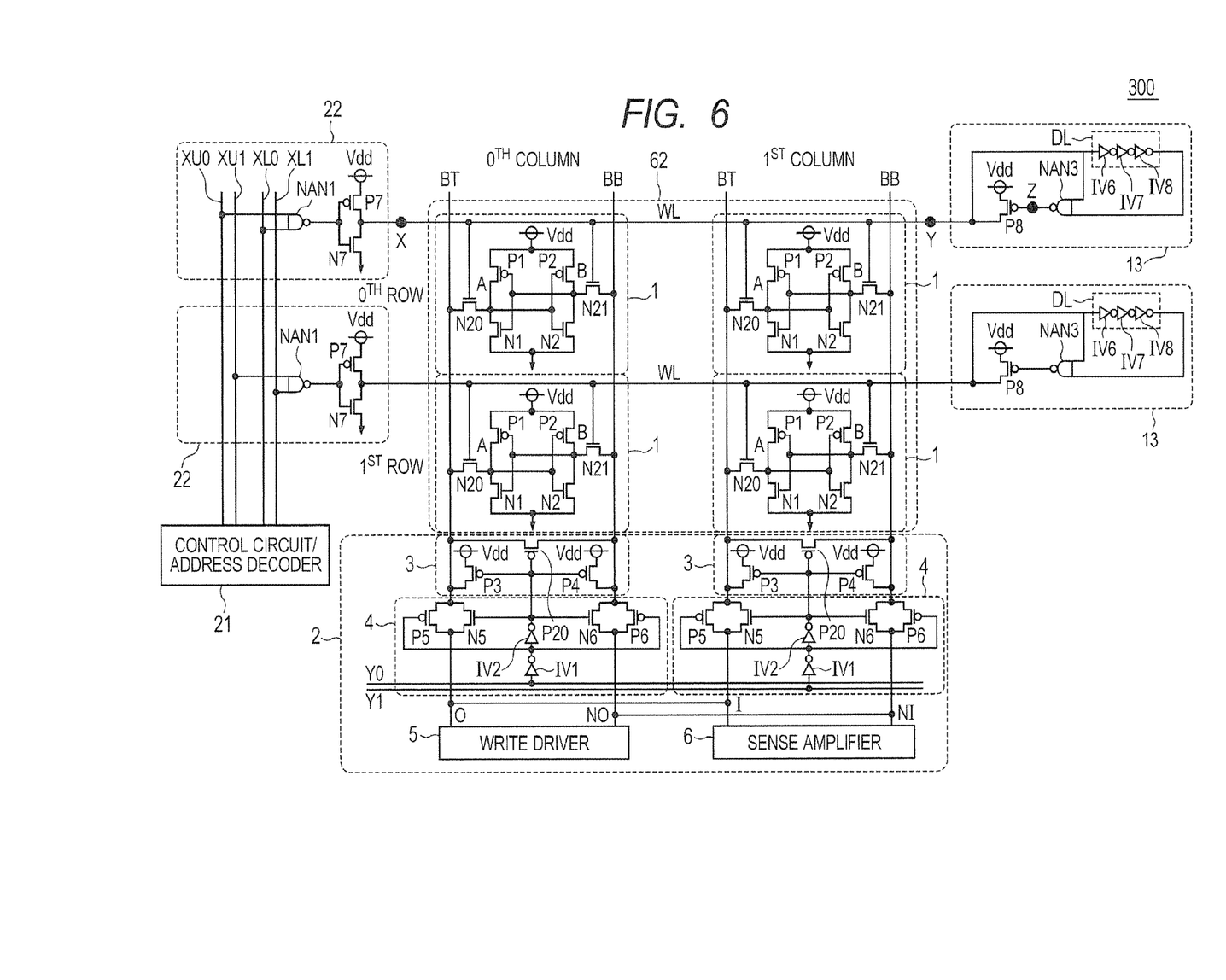
FIG. 6 is a diagram illustrating a configuration of a semiconductor device of a fourth embodiment.

FIG. 6 is a diagram illustrating a semiconductor device of the fourth embodiment.

Descriptions will now be made to any of those differences of a semiconductor device 300 of FIG. 6 from the semiconductor device 100 of FIG. 2.

An assist driver 13 includes a NAND circuit NAN3, a PMOS transistor P8, and a delay circuit DL. The delay circuit DL includes three stages of inverters IV6, IV7, and IV8.

The input of the inverter IV6 is coupled to the terminal end Y of the word line WL, the input of the inverter IV7 is coupled to the output of the inverter IV6, and the input of the inverter IV8 is coupled to the input of the inverter IV7.

The PMOS transistor P8 is provided between the terminal end Y of the word line WL and the power source Vdd. The PMOS transistor P8 will be ON by a one-shot pulse which will be at a low level for a predetermined period of time since the voltage of the terminal end of the word line WL has risen up to a predetermined value, at the rising time of the word line WL.

One input of the NAND circuit NAN3 is coupled to the terminal end Y of the word line WL, while the other input thereof is coupled to the output of the inverter IN8. The output of the NAND circuit NAN3 is coupled to the gate of the PMOS transistor P8.

Figure 7:
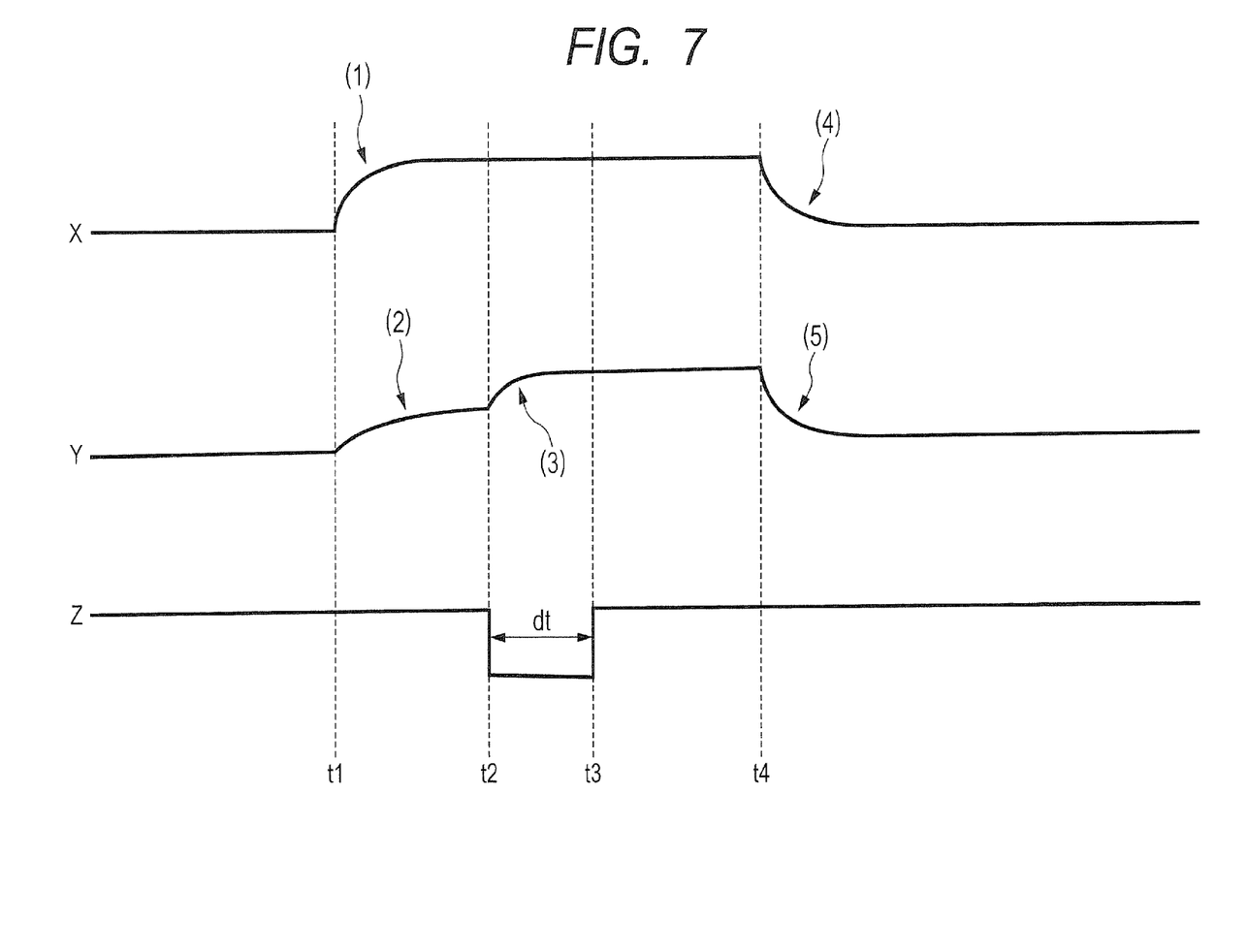
FIG. 7 is a diagram illustrating voltage changes of the front end and the terminal end of a word line WL, and an assist driver, in the fourth embodiment.

FIG. 7 is a diagram illustrating voltage changes of the front end and terminal end of a word line WL, and an assistant driver 13, in the fourth embodiment.

At a time t1, when the front end X of the word line WL is coupled to the power source Vdd by the word line driver 22 of a selected row, the voltage of the front end X of the word line WL rises relatively at a high speed, as illustrated by (1), while the voltage of the terminal end Y of the word line WL rises relatively at a low speed, as illustrated by (2).

At a time t2, when the voltage of the terminal end Y of the word line WL is sufficiently high and exceeds a threshold value of the inverter IV6, a one-shot pulse is generated by the delay circuit DL and the NAND circuit NAN3. This one-shot pulse is for causing the voltage of the output terminal Y of the NAND circuit NAN3 to be at a low level in a period since the time t2 until a delay time dt by the delay circuit DL, as illustrated by (3). Then, the PMOS transistor P8 in the assist driver 10 will be ON. As a result, the power source Vdd is coupled to the terminal end Y of the word line WL, thus accelerating the rise of the voltage at the terminal end Y, as illustrated by (3).

At a time t3, when the one-shot pulse ends, and when the voltage of the terminal Z is at a high level, the PMOS transistor P8 in the assist driver 10 will be OFF. As a result, the power source Vdd and the terminal end Y of the word line WL are disconnected.

At a time t4, when the selected row shifts to a non-selected row, and when the front end X of the word line WL is grounded by the word line driver 22, the voltage of the front end X of the word line WL falls relatively at a high speed, as illustrated by (4). Because the PMOS transistor P8 has already been OFF, the voltage of the terminal end Y of the word line WL falls relatively at a high speed as well, as illustrated by (5).

Accordingly to this embodiment, as described above, like the third embodiment, there is no such a phenomenon of the second embodiment that both of the pull-up PMOS transistor P8 in the assist driver 10 and the NMOS transistor N7 included in the word line driver 22 are ON, at the inactivation time of the word line WL. As a result, it is possible to realize the high-speed operation and the low power consumption operation at the inactivation time of the word line WL.

According to this embodiment, like the third embodiment, there is no need to output the control signal pulse PL from the control circuit/address decoder 21, thus increasing the degree of freedom in timing design.

Fifth Embodiment

The memory cells 1 of the above embodiment are vertically long memory cells. The semiconductor device of this embodiment includes laterally long memory cells as memory cells.

Figure 8A:
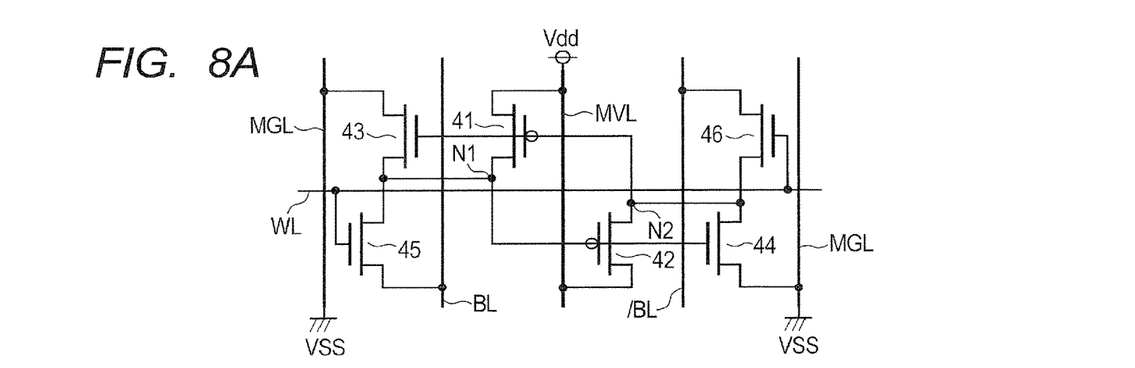
FIGS. 8A to 8C are diagrams each illustrating a configuration and layout of memory cells of a fifth embodiment.

Like the memory cell 1 of the above embodiments, a memory cell MC of this embodiment includes load transistors (P-channel MOS transistors) 41 and 42, driver transistors (N-channel MOS transistors) 43 and 44, and access transistors (N-channel MOS transistors) 45 and 46. See FIG. 8A. This memory cell 500 differs from the memory cell 1, in the layout of the transistors 41 to 46.

Figure 8B:
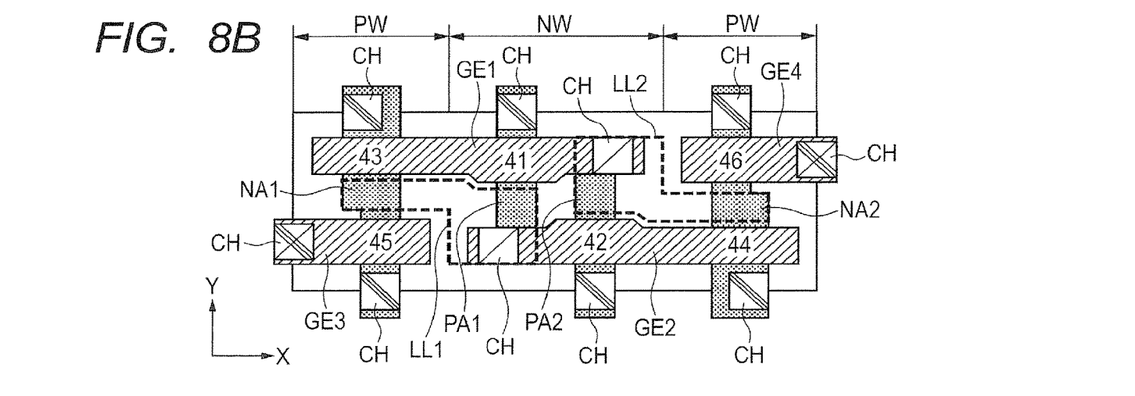

That is, as illustrated in FIG. 8B, the laterally long memory cell MC is formed over the surfaces of one N-type well NW and P-type wells PW and PW arranged on both sides thereof. Those electrodes formed of a polysilicon layer include a gate electrode GE1 extending in an X direction of the illustration from the N-type well NW to one P-type well PW, a gate electrode GE2 extending in the X direction of the illustration from the N-type well NW to the other P-type well PW, a gate electrode GE3 extending in the X direction of the illustration over the one P-type well PW, and a gate electrode GE4 extending in the X direction over the other P-type well PW.

There are formed active layers including an N-type active layer NA1 crossing the gate electrodes GE1 and GE3 in the one P-type well PW, an N-type active layer NA2 crossing the gate electrodes GE2 and GE4 in the other P-type well PW, and P-type active layers PA1 and PA2 crossing the gate electrodes GE1 and GE2 in the N-type well NW.

The gate electrode GE1 and the P-type active layer PA1 form the P-channel MOS transistor 41. The gate electrode GE2 and the P-type active layer PA2 form the P-channel MOS transistor 42. The gate electrode GE1 and the N-type active layer NA1 form the N-channel MOS transistor 43. The gate electrode GE3 and the N-type active layer NA1 form the N-channel MOS transistor 45. The gate electrode GE2 and the N-type active layer NA2 form the N-channel MOS transistor 44. The gate electrode GE4 and the N-type active layer NA2 form the N-channel MOS transistor 46.

A local wiring LL1 is formed across the center section of the N-type active layer NA1, one end section of the P-type active layer PA1, and one end section of the gate electrode GE2. A local wiring LL2 is formed across the center section of the N-type active layer NA2, one end section of the P-type active layer PA1, and one end section of the gate electrode GE1. In FIG. 8B, those parts in which the active layers NA1 and PA1 overlap the local wiring LL1 are conductive. Those parts in which the active layers NA2 and PA2 overlap the local wiring LL2 are conductive. The gate electrode GE2 and the local wiring LL1 are coupled to each other through a contact hole CH, and the gate electrode GE1 and the local wiring LL2 are coupled to each other through a contact hole CH.

Figure 8C:
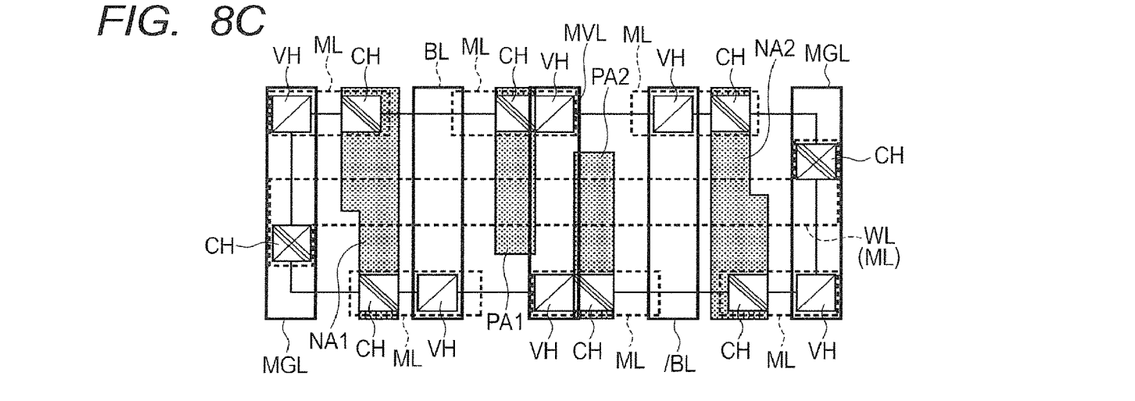

As illustrated in FIG. 8C, a plurality of metal wirings ML extending in the X direction of the illustration are formed of a first aluminum wiring layer. Further, above this, a memory cell grounding wiring MGL, the bit line BL, a memory cell power source wiring MVL, the bit line/BL, and a memory cell grounding wiring MGL, extending in a Y direction of the illustration, are formed of a second aluminum wiring layer. Of the metal wirings ML, a metal wiring crossing the center section of the memory cell MC is the word line WL.

One end (the source of the P-channel MOS transistor 41) of the P-type active layer PA1 is coupled to the memory cell power source wiring MVL through the contact hole CH, the metal wiring ML, and a via hole VH. One end (the source of the P-channel MOS transistor 42) of the P-type active layer PA2 is coupled to the memory cell power source wiring MVL through the contact hole CH, the metal wiring ML, and the via hole VH.

One end (the source of the N-channel MOS transistor 43) of the N-type active layer NA1 is coupled to the memory cell grounding wiring MGL through the contact hole CH, the metal wiring ML, and the via hole VH. One end (the source of the N-channel MOS transistor 44) of the N-type active layer NA2 is coupled to the memory cell grounding wiring MGL through the contact hole CH, the memory wiring ML, and the via hole VH.

The other end (the drain of the N-channel MOS transistor 45) of the N-type active layer NA1 is coupled to the bit line BL through the contact hole CH, the metal wiring ML, and the via hole VH. The other end (the drain of the N-channel MOS transistor 46) of the N-type active layer NA2 is coupled to the bit line/BL through the contact hole CH, the metal wiring ML, and the via hole VH. The gate electrodes GE3 and GE4 are coupled to the word line WL respectively through the contact holes CH.

In this embodiment, as described above, because the memory cells MC are laterally long, the word lines WL of this embodiment are formed long. The long word lines WL cause an apparent problem, at the time of activating the word line WL, that the rising speed of a voltage in a position far from the word line driver 22 is lower than the rising speed of a voltage in a position close to the word line driver 22.

The semiconductor device of this embodiment includes the assist drivers 10, 11, and 13 described in the first to fourth embodiments, thereby preventing this problem.

In the above embodiments, the write driver 5 and the sense amplifier 6 are provided for each adjacent two columns, and coupled to the bit line pair BT and BB of the adjacent two columns. However, the present invention is not limited to this. The write driver 5 and the sense amplifier 6 may be provided for each adjacent three or more columns, and may be coupled to the bit line pair BT and BB of the adjacent three or more columns.

Accordingly, the present invention made by the present inventors has specifically been described based on the preferred embodiments. However, the present invention is not limited to the preferred embodiments. Needless to say, various changes may be made without departing from the scope thereof.

What is claimed is:

1. A semiconductor device comprising:
   a memory array which includes a plurality of memory cells arranged in a matrix;
   word lines which are provided and correspond respectively to rows of the memory array;
   word line drivers which are coupled to ends of the word lines, and activate the word lines by coupling the one ends of the word lines to a first power source, when a corresponding row is selected; and
   assist drivers which are coupled to other ends of the word lines, and couple the other ends of the word lines to the first power source in accordance with a voltage of the other ends of the word lines,
   wherein each of the assist drivers receives a control signal pulse, and wherein the control signal pulse is transmitted to the assist drivers through a signal wiring.

2. The semiconductor device according to claim 1, wherein each of the assist drivers includes a PMOS transistor provided between a power source and the other end of each of the word lines.

3. The semiconductor device according to claim 2, wherein each of the assist drivers includes a NAND circuit, having one input coupled to the other end of the word line, other input receiving a control signal pulse, and an output coupled to a gate of the PMOS transistor.

4. The semiconductor device according to claim 1, wherein the control signal pulse is at a high level in a period since a rising start time of the word line until a voltage of the other end of the word line reaches a voltage of the first power source, and the pulse is at a low level in a period since a falling start time of the word line until the voltage of the other end of the word line reaches a ground voltage.

5. The semiconductor device according to claim 1, wherein the signal wiring is arranged on an outside of the memory array, in a direction horizontal to a substrate where the semiconductor device is implemented, and wherein the control signal pulse is commonly shared by a plurality of assist drivers coupled to the other ends of their corresponding word lines.

6. The semiconductor device according to claim 5, further comprising:
a control circuit including a row decoder,
wherein the row decoder generates a row selection signal in accordance with a row address signal to drive the address-designated word line WL into a selection state, and
wherein the signal line is electrically connected to the control circuit to transmit the control signal from the control circuit to the assist drivers.

7. The semiconductor device according to claim 5, wherein the signal line extends in a direction parallel to the word line.

8. The semiconductor device according to claim 5, wherein a width of the signal line is larger than a width of the word line.

9. The semiconductor device according to claim 1, wherein each of the memory cells is an SRAM.

10. The semiconductor device according to claim 9, wherein each of the memory cells is a laterally long cell.

11. The semiconductor device according to claim 9, further comprising:
a bit line pair which is provided and corresponds to each of columns of the memory array,
wherein the memory cell includes:
a first load transistor electrically coupled between a first power node and a first node;
a first drive transistor electrically coupled between the first node and a second power node;
a first access transistor electrically coupled between the first node and one of the bit line pairs;
a second load transistor electrically coupled between the first power node and a second node;
a second drive transistor electrically coupled between the second node and the second power node;
a second access transistor electrically coupled between the second node and the other bit line of the bit line pairs;
a first and a second P-well;
an N-well; and
a first to fourth active regions,
wherein the N-well is arranged between the first and the second P-well to be adjacent to each other,
wherein the second and third active regions are formed on the N-well,
wherein the first and fourth active regions are formed on the first and second P-wells respectively,
wherein the second active region is arranged between the first and third active regions,
wherein the third active region is arranged between the second and fourth active regions,
wherein the first drive transistor and the first access transistor are formed on the first active region,
wherein the first load transistor is formed on the second active region,
wherein the second load transistor is formed on the third active region,
wherein the second access transistor and the second drive transistor are formed on the fourth active region,
wherein gate electrodes of the first load transistor and the first drive transistor are formed of a first metal line, and
wherein gate electrodes of the second load transistor and the second drive transistor are formed of the second metal line.

12. The semiconductor device according to claim 1, further comprising:
a bit line pair which is provided and corresponds to columns of the memory array,
wherein an output unit is coupled to the bit line pair of a plurality of adjacent columns, and outputs a voltage in accordance with written data to a bit line pair of a selected column from the adjacent columns, at time of writing data to the memory cell.

13. The semiconductor device according to claim 1, further comprising:
a bit line pair which is arranged and corresponds to the columns of the memory array; and
a sense amplifier which is coupled to a bit line pair of adjacent columns, and amplifies a voltage of a bit line pair of a selected column from the adjacent columns, at time of reading data from the memory cell.

14. A semiconductor device comprising:
a memory array which includes a plurality of memory cells arranged in a matrix;
word lines which are provided and correspond respectively to rows of the memory array;
a bit line pair which is provided and corresponds to columns of the memory array;
word line drivers which are coupled to ends of the word lines, and activate the word lines by coupling the one ends of the word lines to a first power source, when a corresponding row is selected; and
assist drivers which are coupled to other ends of the word lines, and couple the other ends of the word lines to the first power source in accordance with a voltage of the other ends of the word lines,
wherein each of the assist drivers includes:
a PMOS transistor provided between a power source and the other end of each of the word lines; and
a delay circuit coupled to the other end of the word line and a NAND circuit having one input coupled to the other end of the word line, other input receiving an output of the delay circuit, and an output coupled to the gate of the PMOS transistor,
wherein the memory cell includes:
a first load transistor electrically coupled between a first power node and a first node;

a first drive transistor electrically coupled between the first node and a second power node;

a first access transistor electrically coupled between the first node and one of the bit line pairs;

a second load transistor electrically coupled between the first power node and a second node;

a second drive transistor electrically coupled between the second node and the second power node;

a second access transistor electrically coupled between the second node and the other bit line of the bit line pairs;

a first and a second P-well;

an N-well; and a first to fourth active regions, wherein the N-well is arranged between the first and the second P-well to be adjacent to each other, wherein the second and third active regions are formed on the N-well, wherein the first and fourth active regions are formed on the first and second P-wells respectively, wherein the second active region is arranged between the first and third active regions, wherein the third active region is arranged between the second and fourth active regions, wherein the first drive transistor and the first access transistor are formed on the first active region, wherein the first load transistor is formed on the second active region, wherein the second load transistor is formed on the third active region, wherein the second access transistor and the second drive transistor are formed on the fourth active region, wherein gate electrodes of the first load transistor and the first drive transistor are formed of a first metal line, and wherein gate electrodes of the second load transistor and the second drive transistor are formed of the second metal line.

* * * * *